United States Patent
Jang et al.

(10) Patent No.: US 6,309,951 B1
(45) Date of Patent: Oct. 30, 2001

(54) METHOD FOR CRYSTALLIZING AMORPHOUS SILICON

(75) Inventors: Jin Jang, 1 Whoiki-dong, Dongdaemoon-ku; Jong-Kab Park, both of Seoul (KR)

(73) Assignees: LG. Philips LCD Co., Ltd.; Jin Jang, both of Seoul (KR)

( * ) Notice: Subject to any disclaimer, the term of this patent is extended or adjusted under 35 U.S.C. 154(b) by 0 days.

(21) Appl. No.: 09/327,161

(22) Filed: Jun. 9, 1999

Related U.S. Application Data

(63) Continuation-in-part of application No. 09/115,498, filed on Jul. 14, 1998.

(30) Foreign Application Priority Data

Jun. 10, 1998 (KR) .................................................. 98-21378

(51) Int. Cl.⁷ .............................. H01L 21/36; H01L 21/84
(52) U.S. Cl. ........................ 438/486; 438/479; 438/482; 438/487; 438/166; 438/466
(58) Field of Search ...................................... 438/166, 486, 438/487, 478, 479, 482, 466; 257/66

(56) References Cited

U.S. PATENT DOCUMENTS 5,426,064 * 6/1995 Zhang et al. .
5,789,284 * 8/1998 Yamazaki et al. .
5,963,823 * 10/1999 Yamazaki et al. .

* cited by examiner

*Primary Examiner*—Charles Bowers
*Assistant Examiner*—Stephen W. Smoot
(74) *Attorney, Agent, or Firm*—Long, Aldridge & Norman LLP

(57) ABSTRACT

A method of crystallizing an amorphous film comprises the steps of forming an amorphous film capable of being crystallized on a substrate, the amorphous film being in contact with a Co thin film, and crystallizing the amorphous film by forming and electric field in the amorphous film and the Co thin film, while simultaneously subjecting the amorphous film and the Co thin film to a thermal treatment, thereby crystallizing the amorphous film.

41 Claims, 5 Drawing Sheets

METHOD FOR CRYSTALLIZING AMORPHOUS SILICON

This is a continuation-in-part of application Ser. No. 09/115,498, filed Jul. 14, 1998. This application claims the benefit of Korean Patent Application No. 1998-21378, filed Jun. 10, 1998.

BACKGROUND OF THE INVENTION

1. Field of the Invention

The present invention relates to a method for crystallizing an amorphous silicon film. More particularly, the present invention relates to a method for crystallizing an amorphous silicon film by forming electrodes on the amorphous film, providing a very thin cobalt (Co) thin film between two electrodes, and applying an electrical field across the amorphous silicon film while heating the amorphous silicon film, thereby lowering a crystallization temperature.

2. Discussion of the Related Art

Polycrystalline silicon films have come into widespread use as active regions of thin film transistors in semiconductor devices, especially for liquid crystal displays. The use of polycrystalline silicon in thin film transistors has increased because polycrystalline silicon has lower defect density and higher field effect mobility than amorphous silicon. While polycrystalline silicon is usually formed under high temperature conditions, methods of fabricating polycrystalline silicon thin film transistors (polysilicon TFT) under low temperatures have recently been introduced.

Low temperature polycrystalline silicon (polysilicon) can be manufactured on a relatively large scale using a low processing temperature and can be manufactured to have performance characteristics similar to high temperature polysilicon. Various methods are known for forming low temperature polysilicon such as solid phase crystallization, laser crystallization and the like.

A laser crystallization is a method of crystallizing an amorphous silicon film by thermal treatment applied to the amorphous silicon film using a laser. For example, a low temperature crystallization, as described by Hiroyaki Kuriyama et al., *Jpn. J. Phys.* 31, 4550 (1992), is performed at 400° C. and provides a crystallized product having excellent performance characteristics. Unfortunately, this method is unsuitable for uniform crystallization and fabrication of polysilicon on large substrates because of its low throughput and the need to employ expensive equipment.

A solid phase crystallization requires thermal treatment of amorphous silicon at 600 to 700° C. for 1 to 24 hours, uses inexpensive equipment, and produces crystals of uniform grain size. However, the method cannot be applied to amorphous silicon formed over glass substrates, due to the method's relatively high temperature and long processing time. This method also has poor yields.

A recently introduced method for crystallizing amorphous silicon at low temperatures is metal induced crystallization (MIC), discussed in M. S. Haque et al., *Appl. Phys.* 79, 7529 (1996). The MIC is an excellent method for reducing the temperature of crystallizing amorphous silicon and involves providing a specific kind of metal in contact with amorphous silicon. The metal may be provided as a thin film on the amorphous silicon so that the metal provides nucleation sites over the amorphous film. In the MIC using Ni as the nucleation metal, described in C. Hayzelden et al., *J. Appl. Phys.* 73, 8279 (1993), $NiSi_2$ which is the lowest formation energy phase of nickel silicide, forms and acts as a nucleus to accelerate the crystallization of the amorphous silicon. Actually, $NiSi_2$ has the same lattice structure as silicon and the lattice constant of $NiSi_2$ is 5.405 Å, which is close to the 5.430 Å of silicon. Thus, $NiSi_2$ nucleates and accelerates crystallization in the <111> direction, as shown in C. Hayzelden et al., *Appl. Phys. Lett.* 60, 225 (1992). Such a method of MIC is affected by the time and temperature of thermal treatment and the quantity of metal. As the quantity of metal increases, the temperature necessary for the thermal treatment, in general, is reduced.

The MIC has the advantages of increasing the effect of metal induced crystallization proportional to the quantity of metal and decreasing the temperature for low temperature crystallization. On the other hand, the MIC has the disadvantage of changing the intrinsic characteristics of the resulting silicon film due to contamination inside the crystallized silicon film. Moreover, such a method requires a long thermal treatment of 10 hours or more.

A crystallization method using a metal solution to decrease metal contamination caused by the MIC has been proposed. According to this method, the surface of an amorphous silicon film is coated with a metal solution and then the amorphous silicon film is crystallized by metal induced crystallization. This method reduces levels of metal contamination. However, this method has the disadvantage of low crystallization rates.

SUMMARY OF THE INVENTION

Accordingly, the present invention is directed to a method for crystallizing an amorphous film that substantially obviates one or more of the problems due to limitations and disadvantages of the related art.

An object of the present invention is to provide a method of crystallizing an amorphous film at a high speed.

Another object of the present invention is to provide a method of crystallizing an amorphous film by forming electrodes that can be used to apply a voltage across the amorphous film, and conducting a thermal treatment while simultaneously applying an electric field to the amorphous film.

A further object of the present invention is to provide a method of crystallizing an amorphous film by forming electrodes that can be used to apply a voltage across the amorphous film, forming a very thin metal layer connected to the electrodes, and conducting a thermal treatment while simultaneously applying an electric field to the amorphous film.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the present invention of a method of crystallizing an amorphous film includes the steps of: forming an amorphous film capable of being crystallized on a substrate, the amorphous film being in contact with a Co thin film; and crystallizing the amorphous film by forming an electric field in the amorphous film and the Co thin film, while simultaneously subjecting the amorphous film and the Co thin film to a thermal treatment, thereby crystallizing the amorphous film.

In another aspect of the present invention, a method of crystallizing an amorphous film comprising the steps of:

forming an amorphous silicon layer in which a first and a second electrodes and a Co thin film located between the first and the second electrodes are formed; and crystallizing the amorphous film by applying a predetermined voltage between the two electrodes while simultaneously subjecting the amorphous film and the Co thin film to a thermal treatment.

According to another embodiment of the present invention, an amorphous silicon film may be crystallized by forming an integral layer above a substrate, wherein the integral layer includes at least one amorphous silicon film and a crystallization inducing film having Co; forming an electric field about the amorphous silicon film and the crystallization inducing film; and heating the amorphous silicon film and the crystallization inducing film to crystallize the amorphous silicon film.

The integral layer may be prepared by forming the amorphous silicon film above the substrate; and forming the crystallization inducing film above the amorphous silicon film. Alternatively, the integral layer may be prepared by forming the amorphous silicon film above the substrate; forming the crystallization inducing film above the amorphous silicon film; and forming another amorphous silicon film above the crystallization inducing film. The integral layer may also be prepared by forming the crystallization inducing film above the substrate; and forming the amorphous silicon film above the crystallization inducing film.

According to one aspect of the present invention, a buffer layer is disposed between the amorphous silicon film and the substrate or is disposed between the crystallization inducing film and the substrate.

To crystallize the amorphous silicon film, the electric field is provided by at least two electrodes placed on the integral layer. The electrodes are preferably separated by a distance of about 0.0001 to 500 cm. The electrodes are in contact with the amorphous silicon film or in contact with the crystallization inducing film. The crystallization inducing film comprises a plurality of metal layers, at least one of the metal layers being Co, Co alloy or a transition metal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The following embodiments illustrate crystallizing amorphous silicon films by applying voltage to Co electrodes. These embodiments demonstrate methods of crystallizing amorphous silicon films according to the present invention. Three embodiments are described, with the Co electrodes and Co thin film positioned differently with respect to layers of amorphous silicon films.

Figure 1A:
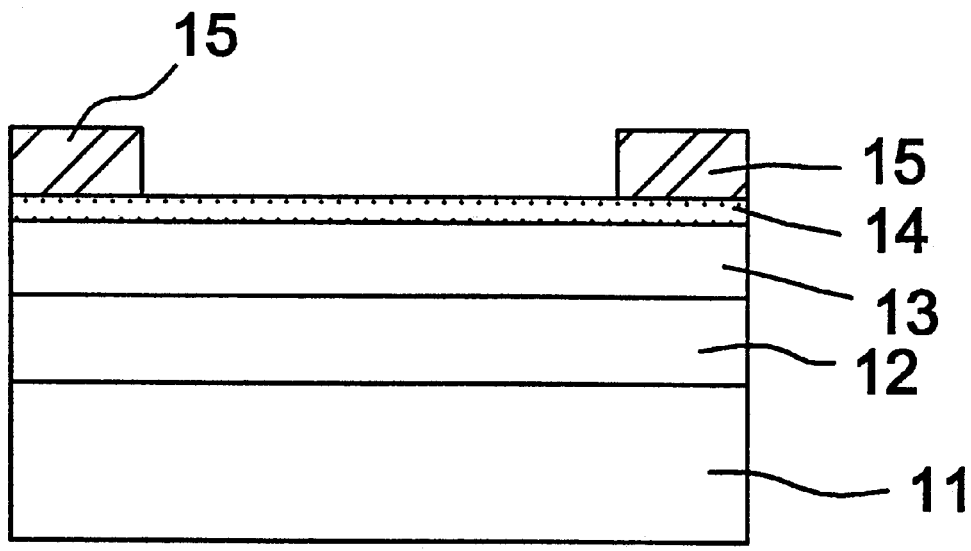
FIGS. 1A to 1C show first, second and third embodiments of crystallizing an amorphous silicon film according to the present invention, prior to crystallization.
Figure 1B:
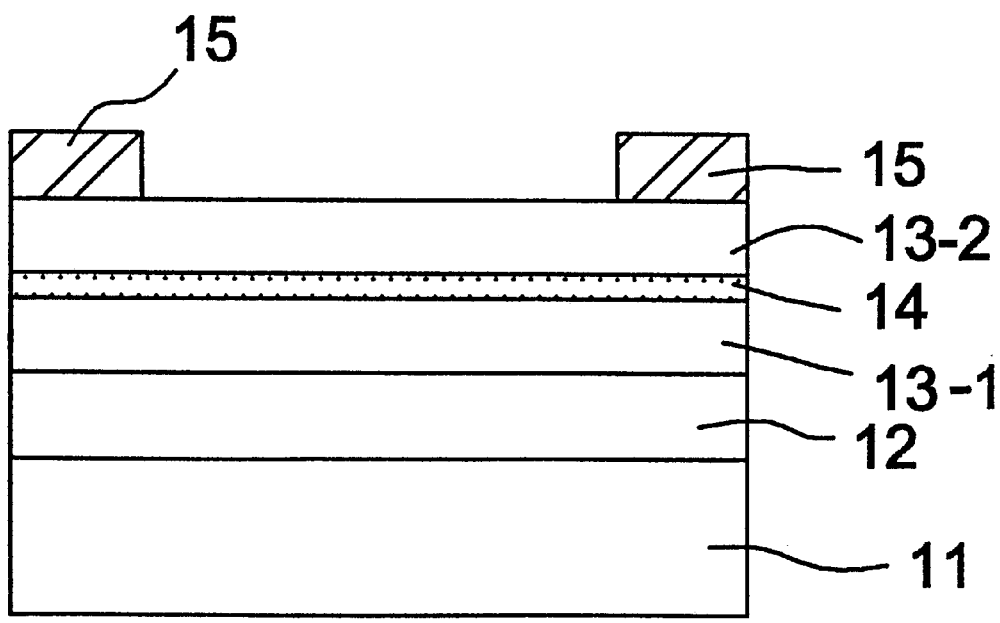
Figure 1C:
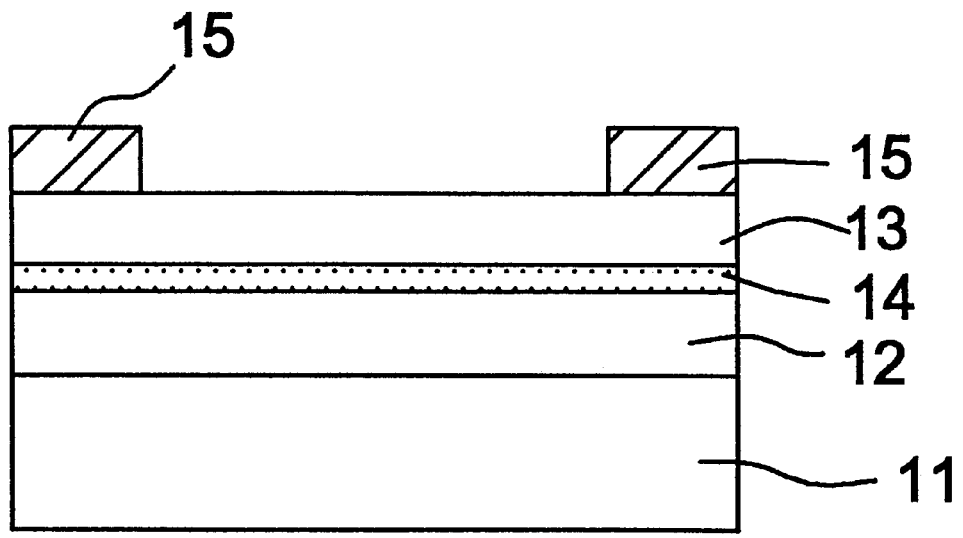
Figure 2:
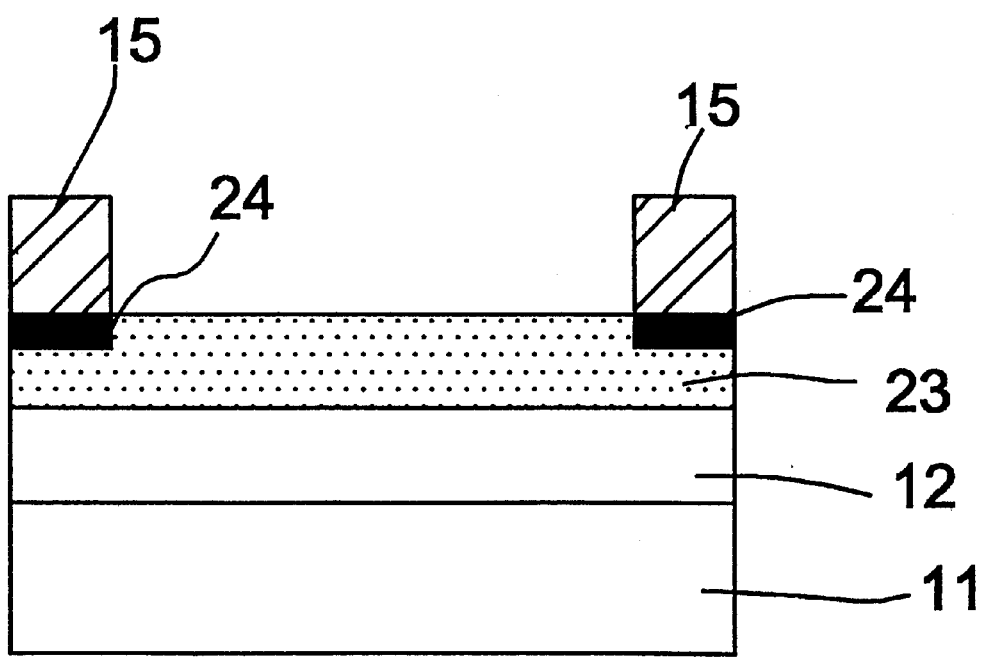
FIG. 2 is a cross-sectional view of the result of crystallization of the embodiments shown in FIGS. 1A to 1C according to the present invention.

FIGS. 1A to 1C are cross-sectional views of the first to the third embodiments before applying an electric field to the Co electrodes. FIG. 2 shows the result of crystallization of the amorphous silicon films of FIGS. 1A to 1C by thermal treatment while applying a voltage to the Co electrodes to form an electric field between the Co electrodes.

FIG. 1A is a cross-sectional view of the first embodiment for crystallizing an amorphous silicon film. An amorphous silicon layer 13 is formed over an insulating substrate 11 and a Co thin film 14 is formed on the amorphous silicon layer 13. The Co thin film 14 is formed by a coating method. And then, electrodes 15 are formed on each end of and on a surface of the Co thin film 14. Quartz, glass, or oxide is used as the insulating substrate 11.

As shown in FIG. 1A, a buffer layer 12 may be inserted between the insulating substrate 11 and the amorphous silicon film 13 to prevent impurities of the insulating substrate 11 from penetrating into the amorphous silicon film 13 during the process of crystallizing the amorphous silicon. Generally, an oxide layer is used as buffer layer 12. Other materials known to one of ordinary skill in the art may be substituted for the buffer layer 12.

FIG. 1B is a cross-sectional view of the second embodiment for crystallizing an amorphous silicon film. A first amorphous silicon layer 13-1 is formed on a buffer layer 12, a Co thin film 14 is formed on the first amorphous silicon layer 13-1 and a second amorphous silicon layer 13-2 on the Co thin film 14. Electrodes 15 are formed on each end of and on a top surface of the second amorphous silicon layer 13-2 or at each side of the second amorphous silicon layer 13-2. Accordingly, the Co thin film 14 is formed and sandwiched between the first and second amorphous silicon layers 13-1 and 13-2.

FIG. 1C is a cross-sectional view of third embodiment for crystallizing an amorphous silicon film. A buffer layer 12 is formed on a insulating substrate 11, a Co thin film 14 is formed on the buffer layer 12 and an amorphous silicon layer 13 is formed on the Co thin film 14. Electrodes 15 are formed on each end of a top surface of the amorphous silicon layer 13 or at each side of the amorphous silicon layer 13.

In the above three embodiments of the present invention, the amorphous silicon films or layers may be formed by any one of PECVD (plasma enhanced chemical vapor deposition), CVD (chemical vapor deposition), sputtering, or the like, wherein the amorphous silicon film is deposited to a thickness of about 100 to 100,000 Å. More particularly, about 100 to 10,000 Å is desirable for the thickness of deposition. Other fabrication technique known to one of ordinary skill in the art may also be used to form the amorphous silicon film.

The Co thin film 14 could be formed using a conventional sputtering, or plasma deposition instead of using the coating method. The Co thin film 14 has an average thickness of 0.001 to 5 Å.

The electrodes could be formed by contacting metal bars on an amorphous silicon layer or by forming a metal material layer and etching the metal material layer using a photolithography. Other suitable etching method may be substituted therefor. The interval or distance between the electrodes is about 0.0001 to 500 cm, preferably 0.01 to 100 cm, and more preferably 1 to 50 cm.

Thermal treatment is applied to the above-described substrate for about 1 to 20 minutes, at a temperature of about 300 to 800° C. and in an atmosphere of nitrogen gas or a vacuum, and with a voltage difference or potential difference between the Co electrodes of about 1 to 1,000,000 V, more desirably 10 to 10,000 V, to form a crystallized silicon film. In this case, the voltage applied between the two Co electrodes may be arranged to vary within the above range over time.

FIG. 2 shows a result of crystallizing the amorphous silicon films shown in FIGS. 1A to 1C, using thermal treatment while applying an electric field to the Co electrodes 15. Referring to FIG. 2, a cross-sectional view of the common result of the first, second and the third embodiments, a crystallized silicon film 23 lies on the buffer layer 12 on the insulating substrate 11. A Co-silicide portion 24 is formed on the portion of the silicon with which the electrodes 15 were in contact.

In these preferred embodiments of the present invention, a Co-silicide layer 24 is formed between the Co electrodes 15 and the portion of the amorphous silicon which contacted the electrodes 15. However, the Co thin film 14 is preferably completely consumed. Amorphous silicon and Co metal 15 in contact with the amorphous silicon (or the Co thin film 14 shown in FIG. 1) forms Co-silicide, after which amorphous silicon is crystallized by $CoSi_2$ which is the lowest energy phase of Co-silicide and works as a nucleus for crystallization. The crystallization speed of the amorphous silicon film 13 increases and the crystallization temperature of the amorphous silicon film 13 is reduced by applying an electric field across the amorphous silicon film and proceeding with thermal treatment. In this case, the Co thin film 14, which is extremely thin, disappears by forming Co-silicide during the thermal treatment for the crystallization of the amorphous silicon and acts as a nucleus for the crystallization process.

In this case, the amorphous silicon film 13 is crystallized in an even shorter time and at an even lower temperature than in conventional methods by forming an electric field on the amorphous silicon film by applying voltage to the electrodes 15. Since the Co in the Co thin film works as an inducing material, the crystallization speed of the amorphous silicon film 13 increases and the crystallization temperature of the amorphous silicon film is reduced. In accordance with the present invention, the amorphous silicon film may be crystallized by thermal treatment at low temperatures of about 300 and 800° C. and in only about 1 to 20 minutes.

The present invention may be applied to the crystallization of amorphous silicon including impurities such as oxygen, nitrogen, carbon and the like, which have concentrations under $10^{22}/cm^3$.

Although Co electrodes 15 are used in the preferred embodiments of the invention, other metals such as a transition metal, a metal, or an alloy of a transition metal known to one of ordinary skill in the art may be used as the electrodes. Moreover, each of the electrodes 15 on the silicon layer may be formed from different metals. Additionally, the electrodes may comprise more than one layer.

Although a metal layer made of Co is used in the preferred embodiments, other materials of a transition metal, or an alloy of transition metals known to one of ordinary skill in the art may be used for the similar result. The metal layer may also be formed to have multi-layers of same or different materials. Even though each electrode is connected to each end of the metal layer of the preferred embodiments of the invention, the same result may be achieved by connecting one electrode to one metal layer and by connecting the other electrode to the other metal layer of a multi-layer metal layer.

Cross-sectional views of the Co electrodes in contact with the amorphous silicon film are shown in the above preferred embodiments of the invention. However, the present invention may be applied to any electrode structure forming an electric field on the amorphous silicon film. Thus, the cross-sectional shape of the electrodes may be any geometric shape, such as rectangular and the like. The shape of the electrode is not critical, as long as the shape of the electrode permits application of electric field to the amorphous silicon film. Moreover, for the same reason, the location or size of the electrodes is not critical and may vary widely. In this regard, the electrodes may be formed to apply an electric field to the amorphous film either vertically or horizontally.

Figure 3:
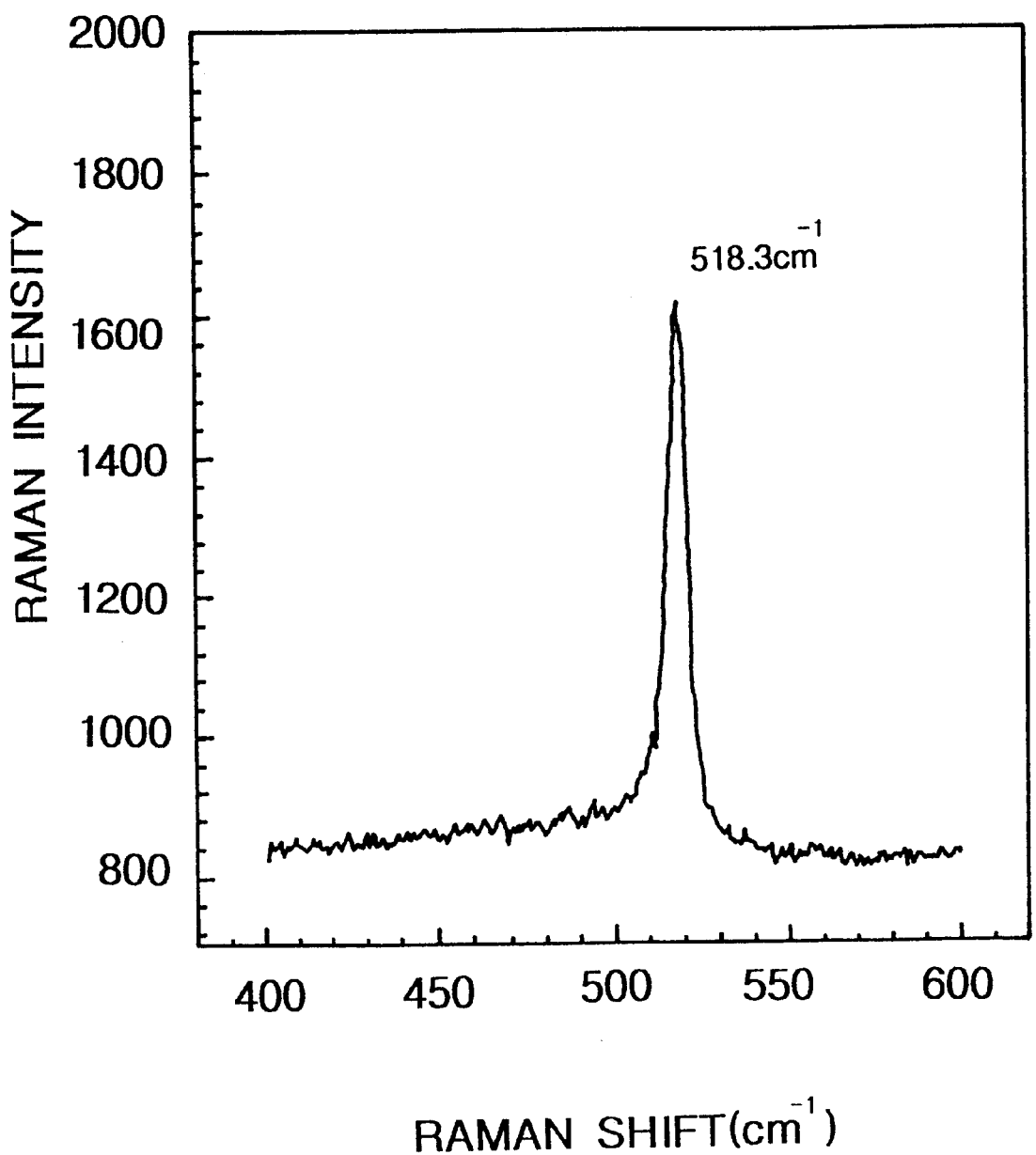
FIG. 3 is a Raman spectrum of a polycrystalline silicon film crystallized in accordance with the present invention.

FIG. 3 shows a Raman spectrum of a polycrystalline silicon film crystallized according to the present invention, wherein thermal treatment was conducted at 400° C. for about 10 minutes while applying an electric field of about 100 V/cm to the amorphous silicon film.

As shown in FIG. 3, there are no peaks at 480 $cm^{-1}$ and a maximum peak is at 518 $cm^{-1}$. As a result, the amorphous phase has disappeared and the crystalline phase has appeared. Namely, the amorphous silicon is crystallized to form poly silicon by the present invention.

Figure 4:
FIG. 4 is a TEM picture of a polycrystalline silicon film crystallized in accordance with the present invention.

FIG. 4 shows a TEM picture of a polycrystalline silicon film crystallized according to the present invention, wherein thermal treatment at a temperature of 400° C. was conducted for 10 minutes while applying an electric field of 100 V/cm to amorphous silicon, in the direction of <111>. The TEM picture reveals no evidence of amorphous phase silicon and silicon crystallization has grown in the direction of <111>.

Figure 5:
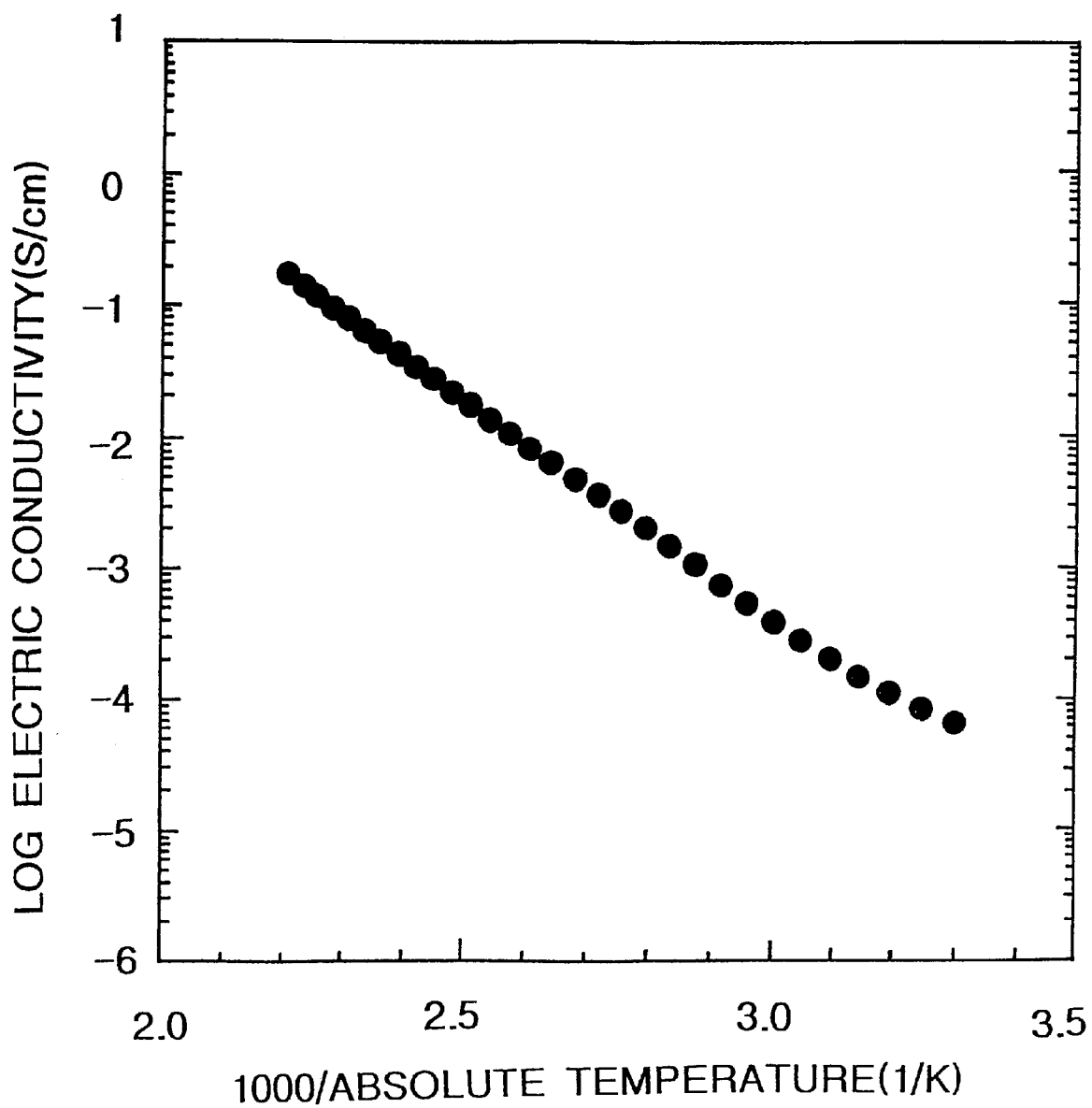
FIG. 5 is a graph of the relationship of the electrical conductivity to temperature of a polycrystalline film crystallized in accordance with the present invention.

FIG. 5 shows a graph of the electrical conductivity of a polycrystalline silicon film crystallized according to the present invention, wherein thermal treatment was conducted for 10 minutes while applying an electric field of 100 V/cm to amorphous silicon. The activation energy attained by the slope of the straight line is 0.54 eV, which is the same value as that attained from intrinsic polycrystalline silicon. Considering the results shown in FIG. 3 to FIG. 5, the method of the present invention produces excellent poly silicon films.

The present invention may be applied to any structure by forming a suitable metal layer on an amorphous silicon film and by forming an electric field in the amorphous silicon film during crystallization. In this regard, there are other suitable methods of applying an electric field to an amorphous film. For example, such methods would include forming first and second electrodes on the amorphous film and then applying an electric field between the first and second electrodes; applying an electric field between the first and second electrodes by contacting the first and second electrodes with each end of the amorphous film, respectively; or placing the amorphous film between the first and second electrodes without actually touching the electrodes.

Although the present invention is exemplified by the crystallization of amorphous silicon, the present invention can be applied to other amorphous groups such as amorphous Si-carbon, amorphous Si-germanium, amorphous Si-nitrogen and the like. Moreover, the present invention can also be applied to any amorphous material for crystallization.

The present invention provides a method of crystallizing an amorphous film by forming electrodes on an amorphous film, forming a metal layer connected to the electrodes and subjecting the amorphous film to thermal treatment while simultaneously applying an electric field to the amorphous film, thereby increasing the speed of crystallization and reducing processing time. Moreover, the present invention eliminates metal contamination caused by crystallization using a metal. In the present invention, the amorphous silicon is crystallized by using the very thin metal layer, for example, Co thin film.

Accordingly, the present invention has following characteristics:

In particular, for an MIC type of crystallization, electric field is applied with annealing to enhance the crystallization process in accordance with the present invention. The crystallization preferably occurs uniformly and at the same time on the entire amorphous silicon. Here, a metal, such as Co, having thickness of about 0.001 to 2.0 Å may be on the entire surface of the amorphous silicon. Moreover, regardless of the size of the amorphous silicon, the rate of crystallization is the same. For example, an amorphous silicon hiving an area of 1 cm×1 cm will crystallize at substantially the same time as an amorphous silicon having an area of 100 cm×100 cm. For example, an amorphous silicon having an area of about 30 cm×30 cm can be crystallized in about 10 minutes in temperature of about 400° C. If a higher temperature is used, such as 550° C., the crystallization occurs much faster. Accordingly, with the present invention, a large size amorphous silicon film can be crystallized relatively quickly. Also, in accordance with the present invention, the rate of crystallization is increased as a higher electric field is applied. The mobility has also increased using the present invention.

The present invention can be employed in the fabrication of a thin film transistor for driving a liquid crystal display (LCD) and other electric devices, such as an SRAM, solar cell, etc.

It will be apparent to those skilled in the art that various modifications can be made in the method of crystallizing an amorphous film of the present invention without departing from the spirit or scope of the invention. Thus, it is intended that the present invention cover the modifications and variations of this invention provided they come within the scope of the appended claims and their equivalents.

What is claimed is:

1. A method of crystallizing an amorphous silicon film comprising the steps of:
    forming an amorphous silicon layer in which first and second electrodes and a Co thin film located between the first and the second electrodes are formed; and
    crystallizing the amorphous silicon film by applying a predetermined voltage to the first and the second electrodes to form an electric field while simultaneously subjecting the amorphous silicon film and the Co thin film to a thermal treatment.

2. The method of claim 1, wherein the step of forming the amorphous silicon layer comprises:
    forming the amorphous silicon film on a substrate; and
    forming the first and the second electrodes and the Co thin film located between the first and the second electrodes on the amorphous silicon film.

3. The method of claim 1, wherein the step of forming the amorphous silicon layer comprises:
    forming a first amorphous film on a substrate;
    forming the first and the second electrodes and the Co thin film located between the first and the second electrodes on the first amorphous silicon film; and
    forming a second amorphous film substantially covering the first and the second electrodes and the first amorphous silicon film.

4. The method of claim 1, wherein the step of forming the amorphous silicon layer comprises:
    forming the first and the second electrodes and the Co thin film located between the first and the second electrodes on a substrate; and
    forming the amorphous silicon film covering the first and the second electrodes.

5. The method of claim 1, wherein the first electrode is formed of one of Co and Co alloy.

6. The method of claim 1, wherein the second electrode is formed of one of Co and Co alloy.

7. The method of claim 1, wherein the first and second electrodes are separated by a distance of about 0.0001 to 500 cm.

8. The method of claim 7, wherein the first and second electrodes are separated by a distance of about 0.01 to 100 cm.

9. The method of claim 8, wherein the first and second electrodes are separated by a distance of about 1 to 50 cm.

10. The method of claim 1, wherein the electric field is formed by creating a voltage difference of about 1 to 1,000,000 V between the first and second electrodes.

11. The method of claim 10, wherein the electric field is formed by creating a voltage difference of about 10 to 10,000 V between the first and second electrodes.

12. The method of claim 10, wherein the electric field is formed by applying a variable voltage between the first and second electrodes during the thermal treatment.

13. A method of crystallizing an amorphous silicon film comprising the steps of:
    forming the amorphous silicon film on a substrate, the amorphous silicon film being in contact with a Co film; and
    crystallizing the amorphous silicon film by forming an electric field in the amorphous silicon film and the Co film, while simultaneously subjecting the amorphous silicon film and the Co film to a thermal treatment;
    wherein the electric field is formed by applying voltage to first and second electrodes each having a thickness of about 1 to 10,000 angstroms.

14. The method of claim 13, wherein the amorphous silicon film includes an impurity concentration of about $10^{22}/cm^3$ or less.

15. The method of claim 13, wherein the Co film is formed by coating with a solution comprising Co.

16. The method of claim 13, wherein the Co film includes at least one of a Co alloy layer and a multi-layer structure comprising the Co film and a metal layer.

17. The method of claim 13, wherein the Co film has a thickness of about 0.001 to 5 angstroms.

18. The method of claim 17, wherein each one of the first and second electrodes is comprised of metal.

19. A method of crystallizing an amorphous silicon film comprising the steps of:
    forming an integral layer above a substrate, wherein the integral layer includes at least one amorphous silicon film and a crystallization inducing film having Co;
    forming an electric field to the amorphous silicon film and the crystallization inducing film; and
    heating the amorphous silicon film and the crystallization inducing film to crystallize the amorphous silicon film;
    wherein the electric field is provided by at least two electrodes placed on the integral layer.

20. The method of claim 19, wherein forming the integral layer comprise the steps of:
   forming the amorphous silicon film above the substrate; and
   forming the crystallization inducing film above the amorphous silicon film.

21. The method of claim 20, wherein a buffer layer is disposed between the amorphous silicon film and the substrate.

22. The method of claim 19, wherein forming the integral layer comprises the steps of:
   forming the amorphous silicon film above the substrate;
   forming the crystallization inducing film above the amorphous silicon film; and
   forming another amorphous silicon film above the crystallization inducing film.

23. The method of claim 22, wherein a buffer layer is disposed between the amorphous silicon film and the substrate.

24. The method of claim 19, wherein forming the integral layer comprise; the steps of:
   forming the crystallization inducing film above the substrate; and
   forming the amorphous silicon film above the crystallization inducing film.

25. The method of claim 24, wherein a buffer layer is disposed between the crystallization inducing film and the substrate.

26. A method of crystallizing an amorphous silicon film comprising the steps of:
   forming an integral layer above a substrate, wherein the integral layer includes at least one amorphous silicon film and a crystallization inducing film having Co;
   forming an electric field to the amorphous silicon film and the crystallization inducing film; and
   heating the amorphous silicon film and the crystallization inducing film to crystallize the amorphous silicon film;
   wherein the electric field is provided by at least two electrodes which are in contact with the amorphous silicon film.

27. The method of claim 26, wherein forming the integral layer comprise; the steps of:
   forming the amorphous silicon film above the substrate; and
   forming the crystallization inducing film above the amorphous silicon film.

28. The method of claim 27, wherein a buffer layer is disposed between the amorphous silicon film and the substrate.

29. The method of claim 26, wherein forming the integral layer comprises the steps of:
   forming the amorphous silicon film above the substrate;
   forming the crystallization inducing film above the amorphous silicon film; and
   forming another amorphous silicon film above the crystallization inducing film.

30. The method of claim 29, wherein a buffer layer is disposed between the amorphous silicon film and the substrate.

31. The method of claim 26, wherein forming the integral layer comprises the steps of:
   forming the crystallization inducing film above the substrate; and
   forming the amorphous silicon film above the crystallization inducing film.

32. The method of claim 31, wherein a buffer layer is disposed between the crystallization inducing film and the substrate.

33. The method of claim 26, wherein the electrodes are separated by a distance of about 0.0001 to 500 cm.

34. A method of crystallizing an amorphous silicon film comprising the steps of:
   forming an integral layer above a substrate, wherein the integral layer includes at least one amorphous silicon film and a crystallization inducing film having Co;
   forming an electric field to the amorphous silicon film and the crystallization inducing film; and
   heating the amorphous silicon film and the crystallization inducing film to crystallize the amorphous silicon film;
   wherein the electric field is provided by at least two electrodes which are in contact with the crystallization inducing film.

35. The method of claim 34, wherein forming the integral layer comprises the steps of:
   forming the amorphous silicon film above the substrate; and
   forming the crystallization inducing film above the amorphous silicon film.

36. The method of claim 35, wherein a buffer layer is disposed between the amorphous silicon film and the substrate.

37. The method of claim 34, wherein forming the integral layer comprises the steps of:
   forming the amorphous silicon film above the substrate;
   forming the crystallization inducing film above the amorphous silicon film; and
   forming another amorphous silicon film above the crystallization inducing film.

38. The method of claim 37, wherein a buffer layer is disposed between the amorphous silicon film and the substrate.

39. The method of claim 34, wherein forming the integral layer comprises the steps of:
   forming the crystallization inducing film above the substrate; and
   forming the amorphous silicon film above the crystallization inducing film.

40. The method of claim 39, wherein a buffer layer is disposed between the crystallization inducing film and the substrate.

41. The method of claim 34, wherein the electrodes are separated by a distance of about 0.0001 to 500 cm.

* * * * *